United States Patent [19]

Ryan

[11] Patent Number: 4,483,001

[45] Date of Patent: Nov. 13, 1984

[54] ONLINE REALIGNMENT OF MEMORY FAULTS

[75] Inventor: Philip M. Ryan, Hopewell Junction, N.Y.

[73] Assignee: International Business Machines Corporation, Armonk, N.Y.

[21] Appl. No.: 388,831

[22] Filed: Jun. 16, 1982

[51] Int. Cl.[3] ..................... G06F 11/10; G11C 29/00
[52] U.S. Cl. ................................. 371/11; 365/200; 371/2; 371/38
[58] Field of Search ............... 371/11, 38, 2; 365/200

[56] References Cited

U.S. PATENT DOCUMENTS 4,074,236 2/1978 Ishida ............................. 365/200
4,365,318 12/1982 Aichelmann, Jr. et al. ........ 365/200

OTHER PUBLICATIONS

P. M. Ryan, Fault Realignment Through Grouping of Compatible Faulty Memory Chips, IBM Tech. Discl. Bulletin, vol. 26, No. 6, Nov. 1983, pp. 2753-2754.
Beausoleil, Maintenance for Memory with Error Correction, IBM Technical Disclosure Bulletin, vol. 11, No. 12, May 1969, pp. 1692-1693.
C. L. Chen, Fault Dispersion in Computer Memories, IBM Technical Disclosure Bulletin, vol. 25, No. 11A, Apr. 1983, pp. 5836-5838.

Primary Examiner—Charles E. Atkinson
Attorney, Agent, or Firm—Richard E. Cummins; Robert J. Haase

[57] ABSTRACT

A method is disclosed for operating a fault tolerant memory system which is provided with a fault alignment exclusion mechanism of the type disclosed in copending application Ser. No. 388,834. The method allows the assignment of a new permute vector to the fault alignment mechanism even though the memory is operating and storing user data. The method rearranges the data in the affected column by transferring data in one chip to another chip in the column through a buffer under the control of the old and new permute vectors. The transfer operation involves transferring the data at the same bit position from each chip in the column to a buffer under the control of the old permute vector and then transferring the data from the buffer to the same bit positions in other chips in the column determined by the new permute vector. The memory is then returned to the user for normal operation.

8 Claims, 4 Drawing Figures

1. UNCORRECTABLE ERROR.    NO
   YES
2. IDENTIFY COLUMNS IN ERROR.
3. DEVELOP NEW PERMUTE VECTOR FOR ONE COLUMN.
4. SET CHIP ADDRESS REGISTER TO ZERO.
5. APPLY OLD PERMUTE VECTOR TO DATA STEERING LOGIC.
6. TRANSFER DATA FROM FIRST GROUP OF CHIPS IN SAID ONE COLUMN TO BUFFER REGISTER OF ASSOCIATED CHANNEL.
7. TRANSFER DATA FROM SECOND GROUP OF CHIPS IN SAID ONE COLUMN TO BUFFER REGISTER OF ANOTHER CHANNEL.
8. REPEAT STEP 7 UNTIL ALL DATA IN COLUMN IS TRANSFERRED TO BUFFER REGISTERS.
9. ASSIGN A NEW PERMUTE VECTOR TO DATA STEERING LOGIC.
10. TRANSFER DATA FROM BUFFER REGISTERS OF SAID ONE COLUMN TO SAID FIRST GROUP OF CHIPS.
11. TRANSFER DATA FROM SAID BUFFER REGISTERS OF SAID ANOTHER CHANNEL TO SAID SECOND GROUP OF CHIPS.
12. REPEAT STEP 11 UNTIL ALL DATA IN SAID BUFFER REGISTERS IS TRANSFERRED TO RESPECTIVE CHIPS IN SAID COLUMN.
13. ADVANCE THE CHIP ADDRESS REGISTER BY 1 AND REPEAT STEPS 5-11 UNTIL ALL THE DATA IN SAID COLUMN IS REARRANGED.

FIG. 4

ONLINE REALIGNMENT OF MEMORY FAULTS

FIELD OF THE INVENTION

1. Background of Invention

This invention relates in general to fault tolerant semiconductor memory systems and, in particular, to a fault tolerant memory system which is provided with an improved system and method for momentarily interrupting the normal operation of the memory in response to detecting an uncorrectable error, developing a new permute address for one of the offending memory columns and automatically transferring the stored data to different chips in the same column.

2. Cross-Referenced Applications

Application serial number 388,834, filed concurrently herewith and assigned to the assignee of the present invention, describes a fault tolerant memory system in which fault alignment exclusion is provided by (1) data steering logic connected between the memory and the multi-word buffer and/or (2) memory address permutation logic to effectively rearrange the chip addresses in the chip column associated with the defective bit position.

Application serial number 388,833, filed concurrently herewith and assigned to the assignee of the present invention, is directed to a method for use with a fault tolerant memory system of the type described in the aforesaid application serial number 388,834 which insures that previously paired chips that resulted in an uncorrectable error will not be similarly aligned at some future time by the realignment process.

Application serial number, 388,830, filed concurrently herewith and assigned to the assignee of the present invention, is directed to a method for storing data in a fault tolerant memory system in which the data portion of the word is stored in either the true or complement form while the check byte portion is always stored in true form to reduce the number of words read from memory that contain more errors than can be corrected by the ECC system.

Application serial number 388,832, filed concurrently herewith and assigned to the assignee of the present invention, is directed to an arrangement for maintaining an up-to-date map of defective bit positions in the memory during actual use of the memory in its working environment.

3. Description of the Prior Art

The cross-referenced applications describe various aspects of fault tolerant memory systems. As described therein and in other prior art systems, chips in the memory array are arranged either physically or electronically to minimize the alignment of defective locations at the same memory address. As will be appreciated by those persons familiar with the art, once the memory is operational in its intended environment and is loaded with customer data, there has been really no fast, economical way to realign a newly developed fault that causes an error which is not correctable by the ECC system. Even though techniques are available to correct the data under some error type conditions (complement/recomplement), the process is considered rather traumatic to system performance by most users, and so many systems merely will bypass that memory location (or inhibit the use of a larger section of addresses including the defective address) rather than to interrupt the system for an extended period of time. While such options are effective for a period of time, the number of bypassed locations eventually increases to the point where system performance is seriously affected. There is, therefore, a need to provide a method and system to permit newly developed faults to be realigned even though the memory is operational in a using system. The present invention provides such a method and system.

SUMMARY OF THE INVENTION

In accordance with the present invention, the operation of the memory system is momentarily interrupted in response to the detecting of a new error which results in an indication by the ECC system that it cannot correct the error in the word just read from memory. It is assumed that the location of the new error can be found by various techniques discussed in the prior art, including the cross-referenced applications. It is further assumed that a new permute vector can be found by prior art teachings, including those of the cross-referenced applications, that will result in the newly developed defective bit position being assigned to a memory address that contains no other defective bit locations. It is, of course, assumed that any previously identified defective bit locations in the column will not be reassigned to memory addresses to cause any uncorrectable errors as a result of the new permutation.

The system, after being interrupted, transfers one bit of data from the same bit position of each chip in the column to be realigned to stages of an output buffer that are determined by the initially assigned permute vector. The data is then transferred to the input buffer whose stages are connected back to the respective chips in the same column in accordance with the newly developed permute vector. The memory system is then returned to normal operation with the newly assigned permute vector being used to address the column of chips in future operations. Since one bit position of each plurality of chips in the column are addressed and read out in parallel, e.g., 16, a 64 chip column could be read with four reads and rewritten to another address with four write operations. If each chip had 64K bit positions and the time required to read or write a chip were, for example, 250 nanoseconds, the entire process would require less than 200 milliseconds.

It is, therefore, an object of the present invention to provide an improved method and system for a fault tolerant memory system in which the memory is momentarily interrupted when a new uncorrectable error is detected to permit the assignment of one new fault alignment permute address and the realignment of previously stored data in the column in accordance with the new permute vector.

The foregoing and other objects, features and advantages of the invention will be apparent from the following more particular description of a preferred embodiment of the invention as illustrated in the accompanying drawings.

BRIEF DESCRIPTION OF THE DRAWINGS

FIG. 4 is a flowchart illustrating the various steps in the fault alignment process of the present invention.

DESCRIPTION OF THE PREFERRED EMBODIMENT

Figure 1:
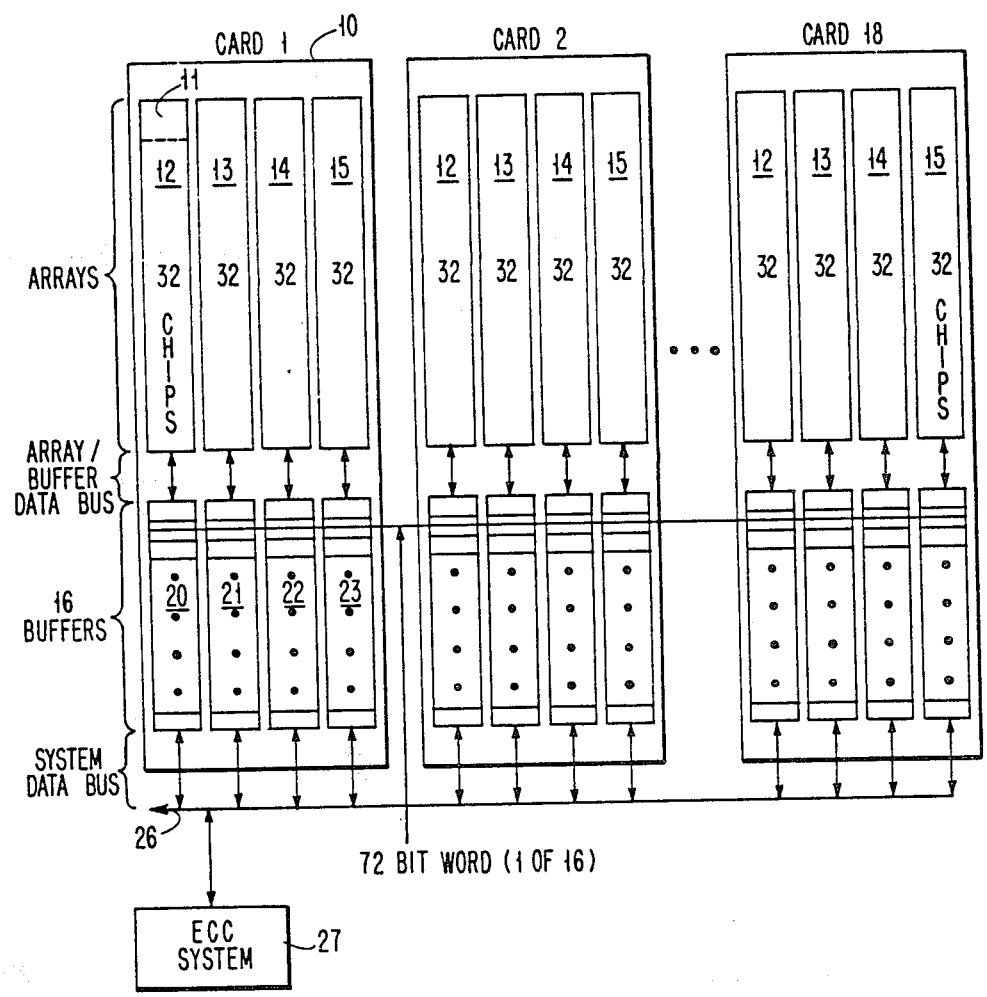
FIG. 1 is a block diagram of a memory system in which the present invention may be advantageously employed.

The memory system shown schematically in FIG. 1 represents generally a conventional large-scale semiconductor memory, for example, a 16 megabyte memory. The memory, as shown in FIG. 1, comprises 18 separate memory cards 10. Each of the cards are identical in that the cards are populated with 128 separate 64K memory chips 11 which are arranged on the card 10 in four separate 32-chip arrays 12, 13, 14 and 15. The system is arranged to provide a 72-bit data word so that each of the 72 (4×18) arrays contributes one bit to each data word. The arrays are addressed in parallel, for example, by a 16-bit address, which defines the 1-bit intersection of one of the 256 rows and one of the 256 columns in each of the separate 64K bit chips. The manner in which chips are selected and read out will be discussed later on in the specification.

As shown in FIG. 1, four 16-bit buffers 20-23 are associated respectively with the chip arrays 12-15 on each card. Each buffer 20, 21, 22 and 23 has 16 buffer positions so that 16 72-bit data words are contained in the buffer. The buffer functions as both input and output.

In addition to address signals, each card is also supplied with suitable read, write and control signals along with conventional clock or timing signals (not shown), as is well known in the art.

Figure 2:
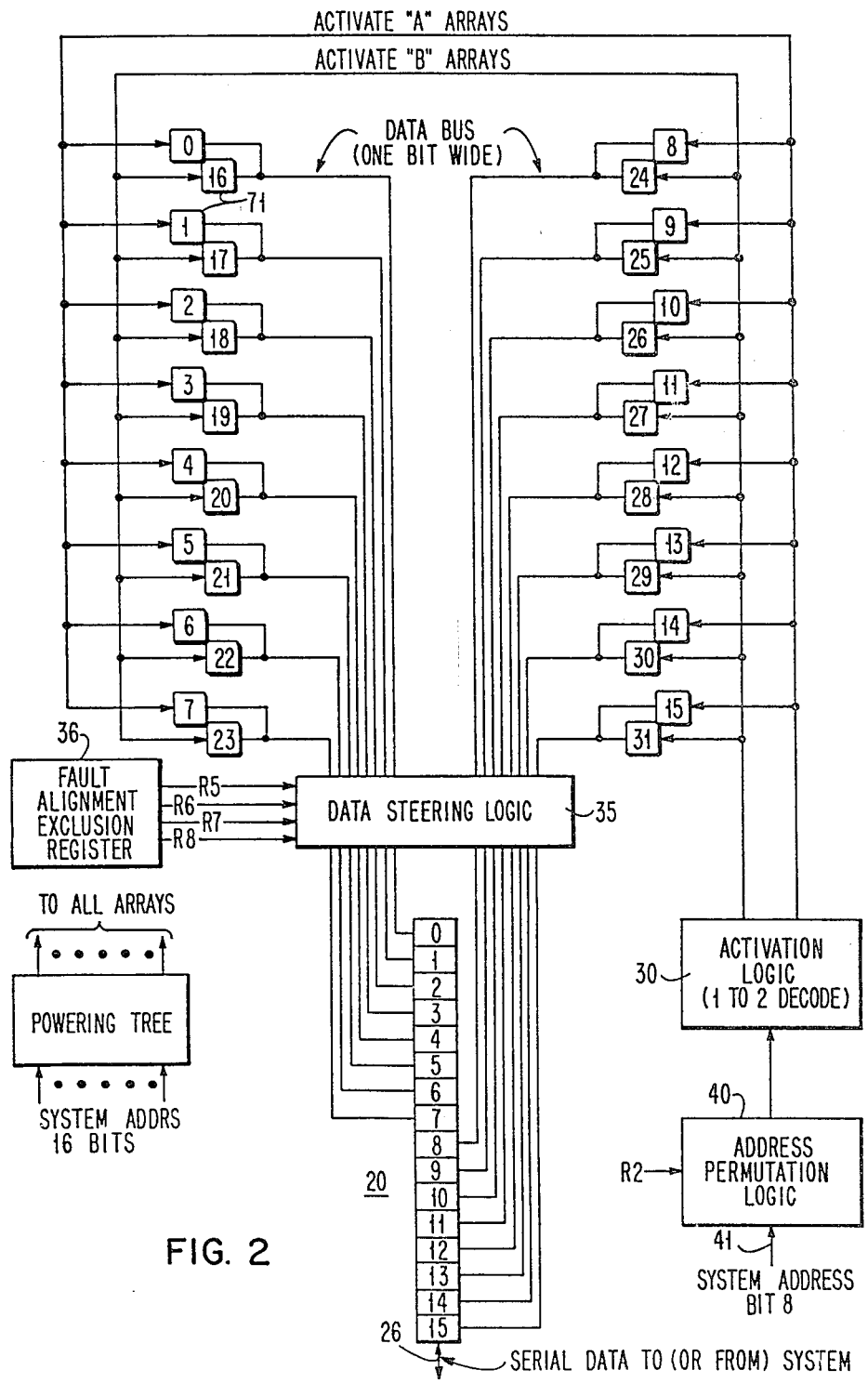
FIG. 2 is a schematic illustration of one channel of the memory array shown in FIG. 1 illustrating the system for rearranging the logical order of the chips in the columns relative to the stages of the buffer register.

The memory shown in FIG. 1 is also referred to as having 72 separate channels in that one 32-chip array 12 and its associated 16-bit buffer 20 comprise one channel which is shown in detail in FIG. 2.

The buffer is connected to the system data bus 26 to transfer the 72-bit words to the system either in serial by bit form or in parallel. It is assumed that a suitable error correcting system 27 (ECC) is provided in the overall arrangement to automatically correct, for example, 1-bit errors in any one bit position of a word. The data word, therefore, includes for example a check byte consisting of 8 bit positions.

It will be appreciated by those persons skilled in the art that it is really not economically feasible to provide a 16 megabyte memory in which there are 128×18 error-free 64K bit memory chips which are all perfect and which will remain error-free for the useful life of the memory. The added cost of providing defect-free chips compared to the cost of a simple ECC system for correcting a single bit error has resulted in most memories being provided with an ECC system of reasonable capability and cost. However, as the number of defects permitted in each 64K chip increases, and the capacity of the memory increases, the probability of encountering an address in memory having more than one defective bit position also increases. Rather than eliminate that address from being used by the system, the arrangement shown in FIG. 2 may be employed with considerable advantage in that, with a small addition of some added logic circuitry, previous storage addresses in memory that would have been skipped in accordance with prior art suggestions can now be employed.

FIG. 2 illustrates in detail one channel of the memory shown in FIG. 1 with the additional logic circuitry, along with additional details of the memory address permutation logic. FIG. 2 shows the individual chips associated with one 32-chip array. As illustrated, the 32 chips are numbered 0-31 and divided into an A array and a B array which, as will be explained in detail later on, are operated at different clock times based on the output of activate logic 30. As shown, the output of one chip 0 and 16 of each array A and B is supplied to stage 0 of the buffer register 20 through data steering logic block 35 which is provided with control signals R5-R8 from a fault alignment exclusion register 36. The general function of logic 35 is to alter the normal relationship of chip 0 for example in the A array and chip 16 in the B array with stage 0 of buffer register 20 so that each of the 32 chips may be selectively connected to each of the 16 stages of buffer 20, depending on the binary pattern of control signals R5 through R8.

The arrangement shown in FIG. 2 also includes address permutation logic 40 which is connected between one address memory line 41 and the activate logic 30 and is supplied with a control signal R2 from the fault alignment exclusion register 36. The function of a permute logic 40 is to effectively change or swap the two associated memory chips in the one channel so that, if a given memory address involves a defective bit position in chip 0, for example, the address permutation logic of the channel can be supplied a control signal R2 which causes the other memory chip 16 to be inserted for chip 0 for that memory address. The objective of steering logic 25 and permutation logic 40 is to limit each memory address to a number of the defective bit locations (1) that is equal to or less than the capability of the ECC system so that an uncorrectable error is never encountered by the overall memory system.

The normal operation of the memory is as follows. The 16 word buffer 20 is connected as shown in FIG. 2. All 18 cards are addressed in parallel with the same 16-bit chip address so that a 72-bit data word is transferred out from 16 chips in the array to the buffer 20 and then to the system bus 26 at one time in response to a read buffer command. Also, 16 data words may be transferred from the system data bus 26 to the buffer 20 in response to a write buffer command.

Transfers between the buffer and the memory are generally similar in that all chips of the array are addressed at the corresponding bit position with 16 bits being read out in parallel from the 16 chips associated with the A array in one clock time and the 16 bits being read out of the chips associated with the B array at some different clock time. With the steering logic in its neutral state, that is, all control signals at binary 0, the output of the chips are supplied to the inputs of the respective stages of the buffer, as shown in FIG. 2 and described above.

As previously mentioned, application of control signals to the steering logic changes the normal relationships that each chip has with its stage of the buffer.

The control signals are supplied from some suitable source, such as another memory associated with the CPU. The control signals are developed prior to storage of data in the memory system by a suitable test program which (1) identifies all defective storage locations in the 16 megabyte memory, and (2) identifies all memory address positions in the memory in which the number of defective bit locations exceeds the corresponding capability of the system error correcting system 26. The identification of (1) and (2) is one of the functions of a conventional ECC system such as represented by the numeral 27 in FIG. 1. Another error mapping scheme is described in copending allowed patent application Ser. No. 345,944, filed on Dec. 17, 1981, in the name of Philip Ryan, entitled Apparatus for High Speed Fault Mapping of Large Memories, and assigned to the present assignee. Control signals R5-R8 and R2 are then developed for the steering logic and/or the address permutation logic in accordance with a suitable algorithm that effectively realigns all but one of the defective bit positions at each memory address that has more than one defect to some other address where no defective positions exist. The complexity of the algorithm will, of course, vary depending on the size of the memory, the width of the data word being transferred between the CPU and the memory, and the number and type of errors permitted in each of the 64K memory chips. A suitable method for producing data steering and address permutation control signals is described in the allowed aforecited patent application Ser. No. 388,833 and in U.S. Pat. No. 3,812,336, issued May 21, 1974 to Douglas C. Bossen et al., entitled Dynamic Address Translation Scheme Using Orthogonal Squares, and assigned to the present assignee. Briefly, logic means are employed to modify each bit of the memory array addressing signals so that non-repetitive combinations of array chips are selected (in succeeding memory read-outs) whenever more than one bit is found to be in error in an accessed data word.

It will be seen that the fault alignment exclusion operation described above is limited to rearranging the order of the chips in the offending column prior to the time that the memory is put online in the system. Once the memory is storing data, the rearrangement of the order of the chips in one row to achieve fault alignment exclusion would not be possible since one bit of every data word stored in memory would be affected.

Figure 3:
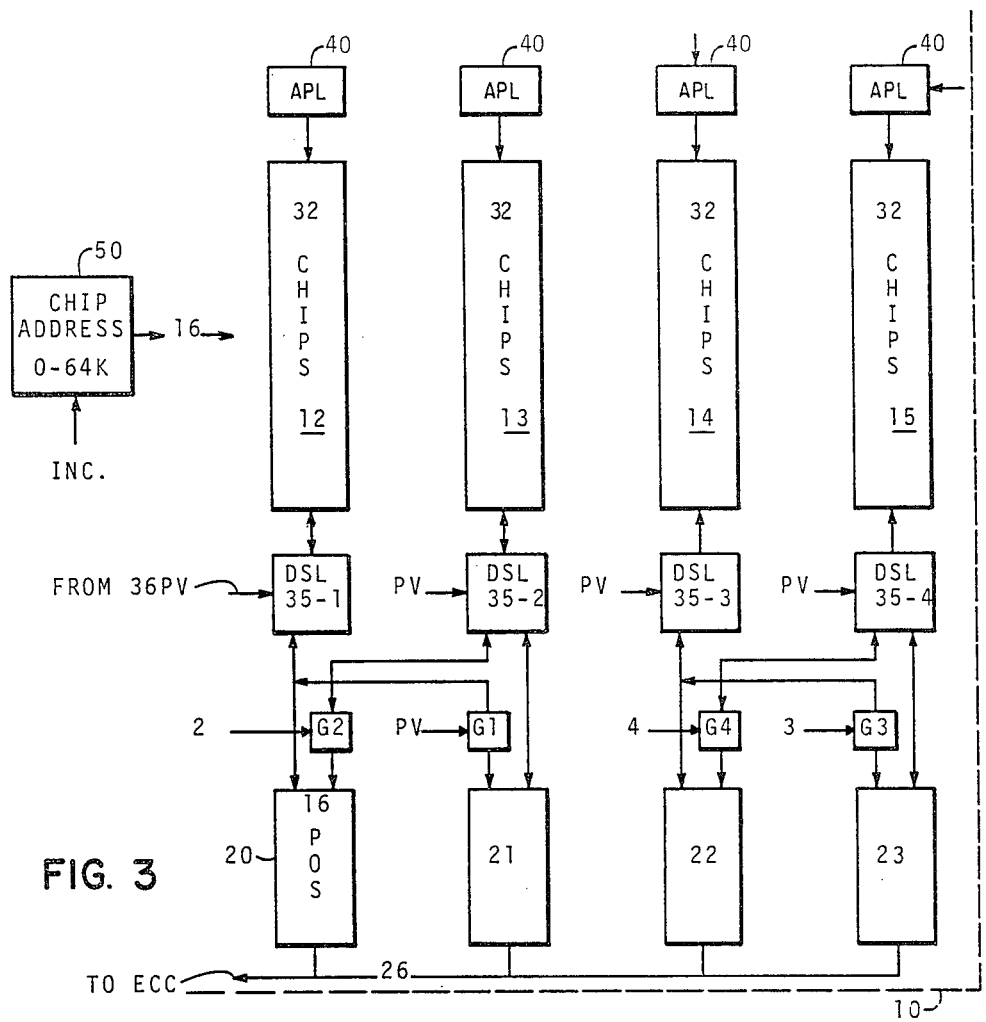
FIG. 3 is a block diagram illustrating the system for causing data in the column containing the newly identified error which caused the ECC system to interrupt operation of the memory system to be rearranged in accordance with the newly developed permute address.

FIG. 3 shows an arrangement of the chip array and buffer on one card of the memory which permits a new permute vector to be calculated for a column containing a defect and used for future memory accesses, even though the memory is loaded with user data. All of the respective cards in the memory array will be similar to the card shown in FIG. 3.

The arrangement shown in FIG. 3 is similar to that shown in FIGS. 1 and 2 with corresponding components being identified with the same reference numerals. The arrangement shown in FIG. 3, in addition, is provided with a means for selectively connecting the output of the data steering logic 35-1 which is normally associated with channel 1 to the buffer register 21 of channel 2 through gate G1. Similarly, the output of the data steering logic 35-2, normally associated with channel 2, is selectively connectable to the buffer register 20 of channel 1 through gate G2. One bit position of each of the 32 chips for array 12 may, therefore, be transferred through data steering logic 35-1 to buffer register 20 and buffer register 21 in two separate read operations. Similarly, the contents of one bit position of each of the 32 chips in arrays 13–15 may also be transferred to two buffer registers through their associated data steering logic blocks 35 which have their outputs selectively connectable to two buffer registers. The operation of the arrangement shown in FIG. 3 is as follows and is summarized in the flow chart of FIG. 4.

As a result of an uncorrectable error being detected by the ECC system, the locations of the two columns containing defective bit positions for that address are identified and a new permute vector is developed for one of the columns which will change the alignment of the chips in that column so that the same error will not occur in the future. However, the data in the column which is to be assigned the new permute vector must be rearranged since the logical order of the chips will be different when the new permute vector is used.

The chip address register 50 is arranged to step through 64K separate chip addresses. At address 0, the first read command transfers 16 bits from chips 0–15 of array 12 (assuming that this column had one of the defects and will be assigned a new permute vector) through data steering logic 35-1 to buffer register 20. A second read operation transfers 16 bits from chips 16-31 of array 12 to buffer register 21 through data steering logic 35-1 and read gate G1 which was conditioned by a suitable gate signal. Data steering logic 35-1 was conditioned by the initial permute vector which was being used at the time that the uncorrectable error was detected. Therefore, the relationship of the first 16 chips to the stages in buffer 20 is determined by the old permute vector. A corresponding relationship exists between chips 16–31 and the stages of buffer 21.

The newly developed permute vector is applied to the data steering logic and the contents of buffers 20 and 21 transferred back to the 32 chips in array 12 by means of a series of two write memory commands.

The chip address register is then incremented by 1 and a series of two read commands employing the old permute vector and a series of two write memory commands using the new permute vector transfer each bit of data at the designated chip address to the same address of another chip. The operation is repeated for each of the 64K separate chip addresses, at the end of which time the memory is put back into the system using the new permute vector for the column.

Assuming a 250 nanosecond read time and write time for each memory address, the total elapsed time that the memory is out of service rearranging data in the one column is in the neighborhood of 200 milliseconds.

Figure 5:
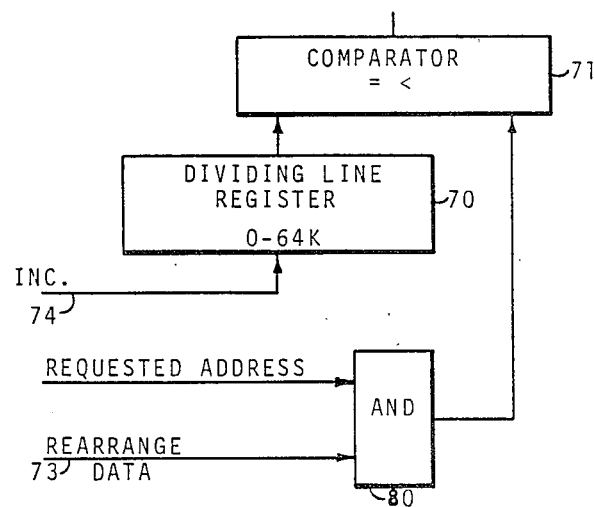

It will be appreciated by those persons skilled in the art that as the capacity of the memory system is increased, the time required to rearrange data in the entire memory from the old vector position to the new vector position may increase to a point where other system considerations and user requirements are adversely affected. Under such conditions, a number of different modifications to the basic system are possible. These modifications allow a data rearranging operation to be performed in stages where each stage lasts for a period of time which does not seriously affect system considerations or user requirements. By providing control circuitry which functions to select either the new permute vector or the old permute vector based on a comparison of the requested memory address and a memory address representing the dividing line between the section of memory that has been updated and the section of memory that still requires an update, the data in the entire memory need not be rearranged during one period of time. The dividing line memory address register is advanced as the data at each address is rearranged in accordance with the new permute vector. The update operation may then be programmed so as not to upset normal operations or function on a "cycle steal" concept, i.e, whenever the system is not using the memory. Such an arrangement is shown functionally in FIG. 5 and comprises dividing line register (D/L Reg) 70, comparator 71 and a number of control lines 73-75. One control line 73 labelled "Rearrange Data" is high from the start of the data rearrangement operation to the finish. The Rearrange Data line functions to gate the desired address through gate 80 to one input of comparator 71. Control line 73 orginates from the system. The other input to comparator 71 is from D/L Reg 70.

The control line 74 labelled "Increment D/L Reg" functions to increment the dividing line register 71 in response to a signal from the data rearranging circuit shown in FIG. 3. The D/L register is incremented by one as the data at each memory address is rearranged.

The output 75 of the comparator 71 indicates whether the current address being requested is in the updated section of the memory, in which case the new permute vector is employed by data steering logic 35 to transfer data between the memory and the buffers. If, however, the comparator indicates the current requested address is in the section of memory that has not been updated, the old permute vector is used by the data steering logic 35 in the data transfer operation. The staging of the data rearrangement operation is controlled by line 73 from the system, which also determines whether the current requested address has to be compared because the rearrange operation is not complete.

While the invention has been particularly shown and described with reference to a preferred embodiment thereof, it will be understood by those skilled in the art that various other changes in the form and details may be made therein without departing from the spirit and scope of the invention. For example, in memory systems in which each array contains 64 chips, all four of the 16 position buffers 20-23 on the card would be selectively connectable to each of the data steering logic blocks 35 on the card to enable all 64 chips to be read out by a series of four consecutive reads and then read back into the array by a series of four consecutive write commands. Similarly, while the buffers have been described as functioning both as input and output buffers, it will be appreciated by those persons skilled in the art that two separate buffers may be employed for each column, one for input and one for output, in which situation the respective stages of the two buffers would be interconnected to complete the data transfer operations described above.

A further refinement which will be appreciated by those skilled in the art comes from the realization that data read from faulty chips will generally contain incorrect data bits. In the process of rearranging the data bits, the incorrect data read from faulty chips will be written into non-faulty chips as incorrect data in fully-functional cells. The result is that for a period of time after the rearrangement is accomplished some data words will contain hard/soft aligned errors, and a number of data words will contain single soft errors. The single soft errors will in time be eliminated by a background "scrubbing" operation, if such is provided by the system, or in the normal course of writing fully correct data words into various memory addresses. The soft "images" of the realigned faults may be eliminated at the time of data swapping by transferring the data in each buffer through the ECC logic, and, if necessary, performing a complement/recomplement operation on words which contain multiple errors, returning fully-corrected data words to the buffers before writing them back to the arrays under the new permute vector. In this way, for a slight increase in the time needed to perform the data-swapping, the soft "images" of hard faults can be fully eliminated before the memory is returned to normal system operation.

Having thus described my invention, what I claim as new and desire to secure by Letters Patent is:

1. A memory system comprising in combination:
   having a number of memory chips arranged in a matrix of N rows and M columns, each said chip having K×L individually addressable data bit positions;
   K×L×N memory addresses, each of which comprises M bit positions;
   a buffer for storing words each comprising M bit positions:
   means for connecting the write input and the read output of each of said chip in each said column of said memory matrix to one of the buffer storage positions associated with each one of said memory columns;
   a source of changeable control signals, and
   data steering logic means connected to said source and said buffer for changing the connective relationship of said buffer storage positions associated with each bit position of said buffer relative to the position of said chips in the corresponding memory matrix column in response to said control signals, said control signals causing said relationship of said chips to said N buffer positions to be altered when said control signals are changed;
   said source producing first and second control signals respectively representing an initial premute vector and a new permute vector,
   said data steering logic means receiving said first control signal during a read operation when the read output of each said chip at a given address is connected to said associated buffer storage positions,
   said data steering logic means receiving said second control signal during a write operation when the write input of each said chip at said given address is connected to said associated buffer storage positions;
   said read and write operations being successive operations and occurring before any address other than said given address is accessed,
   whereby the same data bits read out of said given address of chips is written back into said given address of chips in permuted form.

2. The system recited in claim 1 further characterized by a chip address register for providing one address to each of said chips during transfer from said memory to said buffers and transfers from said buffer to said memory; and
   means for incrementing said chip address register when the data at one memory address has been rearranged in accordance with said new permute vector.

3. A method of operating a memory system having a fault alignment exclusion mechanism which employs an address permute vector for each column of the memory array to change the relationship between each chip in said column and positions of a column buffer, said method being characterized by the following steps:
   (1) reading out data from one position of each chip in the column to positions of a buffer that are selected by a first permute vector; and
   (2) writing each bit of said data from said buffer back to the same address position of another chip in the column that is selected by a second permute vector and repeating the above steps for each chip address.

4. A method of operating a memory system hyaving a fault alignment exclusion mechanism which employs an address permute vector for each column of the memory array to change the relationship between each chip in said column and positions of a column buffer, said method being characterized by the following steps:
   (1) determining if an identified error is correctable, and if not:
   (2) identifying the columns in error;
   (3) developing a new permute vector for one of said columns in error;
   (4) transferring data from one address of a first group of chips in said one column to said column buffer of an associated channel in accordance with an old permute vector;
   (5) transferring data from the said address of a second group of chips in said one column to a column buffer of another channel;
   (6) transferring data from said column buffers of said associated channel to said first group of chips in accordance with said new permute vector;
   (7) transferring data from said column buffers of said another channel to said second group of chips in accordance with said new permute vector;
   (8) advancing the chip address register by 1 and repeating steps 4–7 until all the data in said column is rearranged.

5. The method recited in claim 4 in which the step of advancing the chip address register by 1 is controlled in a manner to permit accesses to said memory system on a selected basis.

6. The method recited in claim 5 in which said selected basis is preprogrammed on the basis of time periods sufficiently short so as not to adversely interfere with the normal operation of said memory.

7. The system recited in claim 4 further comprising:
   (1) means for determining if data at any address in memory that is being addressed has been rearranged in accordance with the new permute vector; and
   (2) means for transferring data between said current address and said system in accordance with said initial permute vector or said new permute vector, depending on whether the data has been rearranged.

8. A method of operating a memory system having a fault alignment exclusion mechnaism which employs an address permute mechanism which employs an address permute vector for each column of the memory array to change the relationship between each chip in said column and positions of a column buffer, said method being characterized by the following steps:
   (1) determining if an identified error is correctable, and if not:
   (2) identifying the columns in error;
   (3) developing a new permute vector for one of said columns in error;
   (4) transferring data from one address of the chips in said one column to said column buffer in accordance with an old permute vector;
   (5) transferring data from said column buffer to said chips in accordnce with said new permute vector;
   (6) advancing the chip address register by 1 and repeating steps 4 and 5 until all the data in said column is rearranged.

* * * * *